(12) United States Patent
Lee et al.

(10) Patent No.: US 7,843,043 B2
(45) Date of Patent: *Nov. 30, 2010

(54) STRUCTURE OF A LEAD-FRAME MATRIX OF PHOTOELECTRON DEVICES

(75) Inventors: Ming-Jing Lee, Tucheng (TW);
Shih-Jen Chuang, Taoyuan Hsien (TW);
Chih-Hung Hsu, Tu Chen (TW);
Chin-Chia Hsu, Taipei (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/463,681

(22) Filed: May 11, 2009

(65) Prior Publication Data

US 2009/0218664 A1 Sep. 3, 2009

Related U.S. Application Data

(63) Continuation of application No. 11/510,661, filed on Aug. 28, 2006, now Pat. No. 7,547,960.

(30) Foreign Application Priority Data

May 4, 2006 (TW) ............................... 95115945 A

(51) Int. Cl.
*H01L 23/495* (2006.01)
(52) U.S. Cl. .................. 257/667; 257/672; 257/666; 257/81; 257/82; 257/88; 257/98; 257/99; 257/100; 257/E23.042

(58) Field of Classification Search .................. 257/99, 257/100, 666–676
See application file for complete search history.

(56) References Cited

U.S. PATENT DOCUMENTS 5,321,305 A 6/1994 Sakamoto
7,547,960 B2 * 6/2009 Lee et al. .................... 257/667

FOREIGN PATENT DOCUMENTS

| CN | 1501488 A | 6/2004 |
|---|---|---|
| CN | 1670970 A | 9/2005 |
| JP | 54-12688 | 1/1979 |
| JP | 02-117182 | 5/1990 |
| JP | 04-260360 | 9/1992 |
| JP | 05190891 | 7/1993 |
| JP | 08167687 | 6/1996 |
| TW | 200307353 | 12/2003 |
| TW | I251941 | 3/2006 |

* cited by examiner

*Primary Examiner*—Jasmine J Clark
(74) *Attorney, Agent, or Firm*—Muncy, Geissler, Olds & Lowe, PLLC

(57) ABSTRACT

A structure of a lead-frame matrix of photoelectron devices is provided. The lead-frame matrix is used to fabricate a first lead-frame array and a second lead-frame array. In the structure of the lead-frame matrix of the photoelectron devices, pins of the first lead-frame array and pins of the second lead-frame array are alternatively inserted.

3 Claims, 3 Drawing Sheets

STRUCTURE OF A LEAD-FRAME MATRIX OF PHOTOELECTRON DEVICES

RELATED APPLICATIONS

This application is a continuation of application Ser. No. 11/510,661, filed Aug. 28, 2006 now U.S. Pat. No. 7,547,960 which claims priority to Taiwan Application Serial Number 95115945, filed May 4, 2006, the disclosure of both the application Ser. No. 11/510,661 and Taiwan Application Serial Number 95115945 are hereby incorporated by reference herein in its entirety.

BACKGROUND

1. Field of Invention

The present invention relates to a structure of a lead-frame matrix of photoelectron devices. More particularly, the present invention relates to a structure of a lead-frame matrix of photo couplers.

2. Description of Related Art

Because of huge amount of consumption of photoelectron devices mass-manufactured by numerous producers, the price of photoelectron devices is getting cheaper and it is more difficult to generate profit from photoelectron devices. The production cost control of photoelectron devices is therefore very important for manufacturers to generate profit from photoelectron devices in such cheap price. The major cost of producing photoelectron devices is material. Therefore, there is a need to reduce the material cost of photoelectron devices in order to increase profit.

SUMMARY

It is therefore an aspect of the present invention to provide a structure of a lead-frame matrix of photoelectron devices, which can reduce the production cost of photoelectron devices and thus increase the profit thereof. Moreover, because the production cost is reduced, the price of photoelectron device can be cheaper.

In accordance with the foregoing and other aspects of the present invention, a structure of a lead-frame matrix of photoelectron devices is provided. The structure of a lead-frame matrix of photoelectron devices comprises a first lead-frame array and a second lead-frame array. Both the first lead-frame array and the second lead-frame array are located on the lead-frame matrix of photoelectron devices. Pins of the first lead-frame array and pins of the second lead-frame array are alternatively inserted.

In accordance with the foregoing and other aspects of the present invention, a structure of a lead-frame matrix of photo couplers is provided. The structure of a lead-frame matrix of photo couplers comprises a transmitter lead-frame array and a receiver lead-frame array. Both the transmitter lead-frame array and the receiver lead-frame array are located on the lead-frame matrix of photo couplers. Pins of the transmitter lead-frame array and pins of the receiver lead-frame array are alternatively inserted. In the preferred embodiment, transmitter sides of the transmitter lead-frame array and receiver sides of the receiver lead-frame array are also alternatively inserted.

In accordance with the foregoing and other aspects of the present invention, a structure of a lead-frame matrix of infrared remote control receiver modules is provided. The structure of a lead-frame matrix of infrared remote control receiver modules has a first lead-frame array of infrared remote control receiver modules and a second lead-frame array of infrared remote control receiver modules. Both the first lead-frame array of infrared remote control receiver modules and the second lead-frame array of infrared remote control receiver modules are located on the lead-frame matrix of infrared remote control receiver modules. Pins of the first lead-frame array of infrared remote control receiver modules and pins of the second lead-frame array of infrared remote control receiver modules are alternatively inserted.

In conclusion, the insertion structure of a lead-frame matrix of photoelectron devices can increase the lead-frame density of the lead-frame matrix. The space of the lead-frame matrix can be well utilized. Therefore, the waste of the lead-frame matrix is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The major cost of producing photoelectron devices is material cost. Therefore, the invention helps to reduce the material cost in order to reduce the overall cost of producing photoelectron devices. In the following, photo couplers, light transmitters/receivers and infrared remote control receiver modules are used as examples to illustrate the concept of the invention. However, the invention is not limited to these photoelectron devices. The concept of the invention can be employed to other photoelectron devices.

Photo Coupler

A photo coupler comprises mainly a transmitter side and a receiver side. A light-emitting element on the transmitter side of the photo coupler emits a light signal and a light-receiving element on the receiver side receives the light signal. The light-emitting element generally is a light emitting diode (LED). The light-receiving element can be a photo diode, a photo transistor or a light-receiving integrated circuit (IC).

Figure 1:
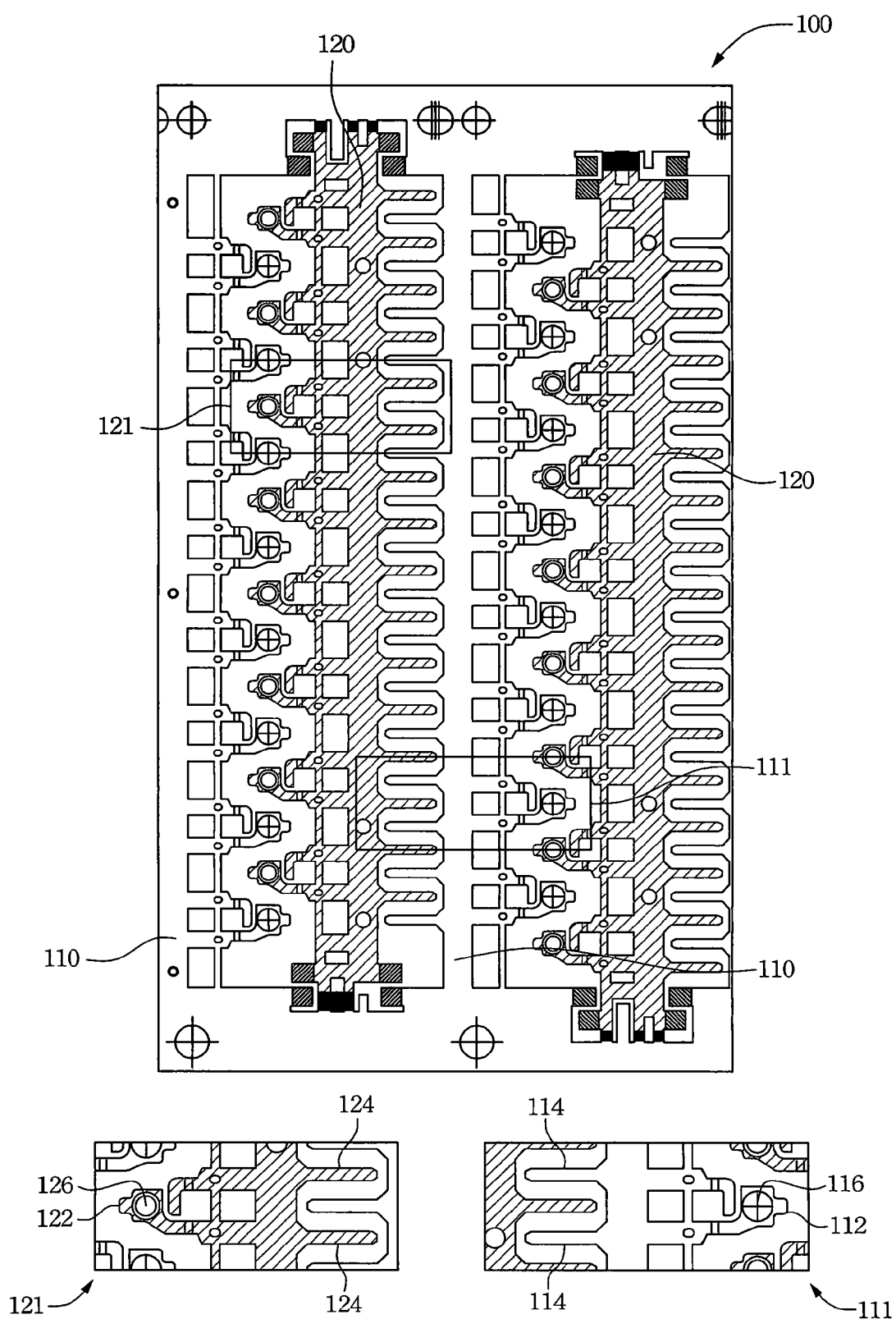
FIG. 1 is a structural drawing of a lead-frame matrix of photo couplers according to a preferred embodiment of the invention.

FIG. 1 is a structural drawing of a lead-frame matrix of photo couplers 100 according to a preferred embodiment of the invention. In FIG. 1, the lead-frame matrix of photo couplers 100 has multiple rows of transmitter lead-frame arrays 110 and multiple rows of receiver lead-frame arrays 120. Each transmitter lead-frame array 110 comprises multiple transmitter lead-frames 111. Each transmitter lead-frame 111 comprises a transmitter side 112, two transmitter pins 114 and a light-emitting element 116 on the transmitter side 112. Each receiver lead-frame array 120 comprises multiple receiver lead-frames 121. Each receiver lead-frame 121 comprises a receiver side 122, two receiver pins 124 and a light-receiving element 126 on the receiver side 122.

In FIG. 1, transmitter lead-frame arrays 110 and receiver lead-frame arrays 120 are located side by side on the lead-frame matrix of photo couplers 100. The transmitter sides 112 of the transmitter lead-frame arrays 110 are adjacent to the receiver sides 122 of the receiver lead-frame arrays 120. The transmitter pins 114 of the transmitter lead-frame arrays 110 are adjacent to the receiver pins 124 of the receiver lead-frame arrays 120. The transmitter sides 112 of the transmitter lead-frame arrays 110 and the receiver sides 122 of the receiver lead-frame array 120 are alternatively inserted. The transmitter sides 112 can be fit into the space between two adjacent receiver sides 122, and the receiver sides 122 can be fit into the space between two adjacent transmitter sides 112. The transmitter pins 114 of the transmitter lead-frame arrays 110 and the receiver pins 124 of the receiver lead-frame array 120 are alternatively inserted. The transmitter pins 114 can be fit into the space between two adjacent receiver pins 124, and the receiver pins 124 can be fit into the space between two adjacent transmitter pins 114. In this structure of the lead-frame matrix of the embodiment of FIG. 1, the space of the lead-frame matrix can be utilized well and efficiently. Therefore, the waste of the lead-frame matrix is reduced and the production cost is thus reduced.

In another embodiment, in order to utilize the space of the lead-frame matrix even more efficiently, the transmitter sides 112 can be fit into the space between two adjacent receiver sides 122 and even connected to the receiver lead-frame array 120, and the receiver sides 122 can be connected to the transmitter lead-frame array 110 in the same way as the transmitter sides 112. Similarly, the transmitter pins 114 can also be connected to the receiver lead-frame array 120, and the receiver pins 124 can be connected to the transmitter lead-frame array 110. In this structure of the lead-frame matrix, more lead-frames can be produced on a lead-frame matrix with higher density of lead-frames. Half more lead-frames than what available on traditional lead-frame matrix can be produced based on the structure of the lead-frame matrix of the invention Light Transmitter/Receiver In the embodiment of photo couplers, the lead-frame of photo coupler comprises transmitter lead-frame and receiver lead-frame. Therefore, these two types of lead-frames are produced on the lead-frame matrix. In the embodiment of light transmitter/receiver, there is only one type of lead-frames, transmitter lead-frame or receiver lead-frame, need to be produced on the lead-frame matrix. The structure of the transmitter lead-frame is similar to that of the receiver lead-frame. The transmitter lead-frame and the receiver lead-frame are distinguished from photoelectron elements displaced thereon. In the transmitter lead-frame, the photoelectron element displaced thereon is a light-emitting element. In the receiver lead-frame, the photoelectron element displaced thereon is a light-receiving element.

Figure 2:
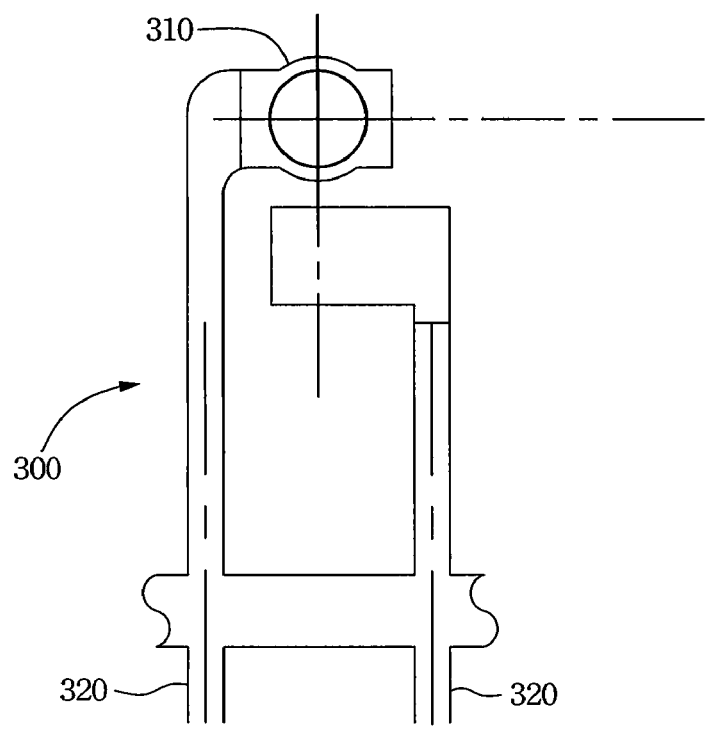
FIG. 2 is a structural drawing of a light transmitter/receiver lead-frame according to a preferred embodiment of the invention.

FIG. 2 is a structural drawing of a light transmitter/receiver lead-frame according to a preferred embodiment of the invention. The light transmitter/receiver lead-frame 300 comprises a transmitter/receiver side 310 and two transmitter/receiver pins 320. A light emitting/receiving element is placed on the transmitter/receiver side 310.

Figure 3:
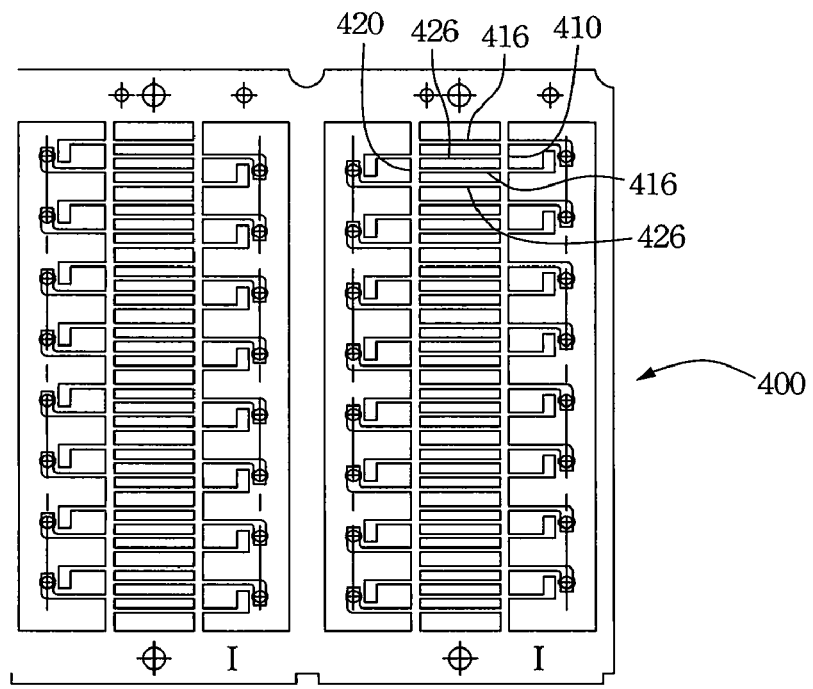
FIG. 3 is a structural drawing of a lead-frame matrix of light transmitters/receivers according to a preferred embodiment of the invention.

FIG. 3 is a structural drawing of a lead-frame matrix of light transmitters/receivers 400 according to a preferred embodiment of the invention. In order to explain the concept of the invention clearly, transmitter/receiver lead-frame arrays with different arrangement direction are named temporarily as a first transmitter/receiver array 410 and a second transmitter/receiver array 420. In fact, the first transmitter/receiver array 410 is totally the same as the second transmitter/receiver array 420.

The first transmitter/receiver array 410 has multiple first transmitter/receiver pins 416. Similarly, the second transmitter/receiver array 420 also has multiple second transmitter/receiver pins 426. The first transmitter/receiver pins 416 and the second transmitter/receiver pins 426 are alternatively inserted. The first transmitter/receiver pins 416 can be fit into the space between two adjacent second transmitter/receiver pins 426 to fill the space and to connect to the second transmitter/receiver array 420. The second transmitter/receiver pins 426 can be fit into the space between two adjacent first transmitter/receiver pins 416 to fill the space and to connect to the first transmitter/receiver array 410.

Infrared Remote Control Receiver Module

Figure 4:
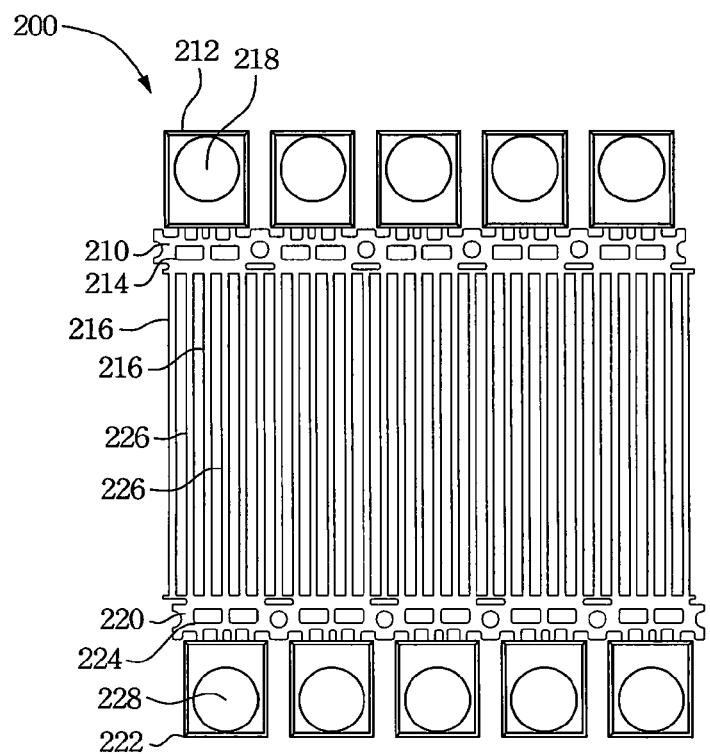
FIG. 4-5 are structural drawings of a lead-frame matrix of infrared remote control receiver modules according to a preferred embodiment of the invention.
Figure 5:
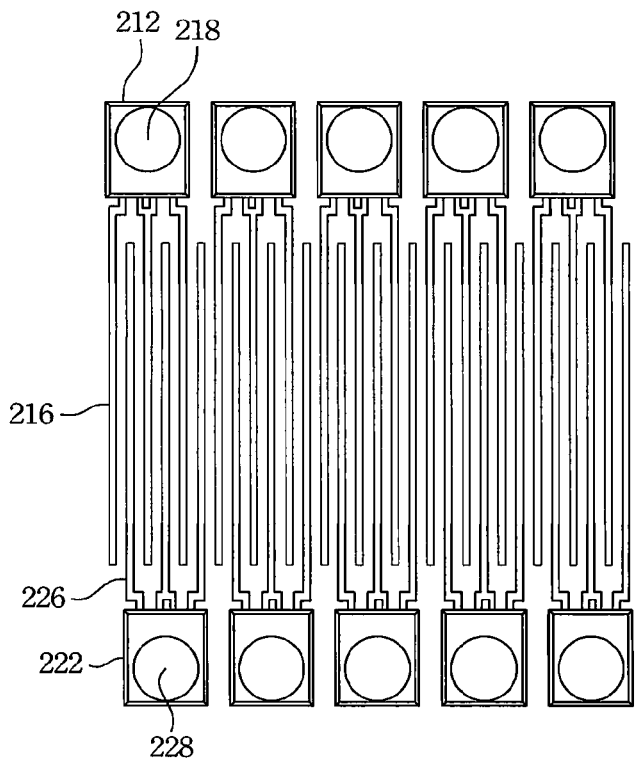

FIG. 4-5 are structural drawings of a lead-frame matrix of infrared remote control receiver modules 200 according to a preferred embodiment of the invention. In FIG. 4, the lead-frame matrix of infrared remote control receiver modules 200 before being cutting is shown. In order to explain the concept of the invention clearly, lead-frame arrays of infrared remote control receiver modules with different arrangement direction are named temporarily as a first lead-frame array of infrared remote control receiver modules 210 and a second lead-frame array of infrared remote control receiver modules 220. In fact, the first lead-frame array of infrared remote control receiver modules 210 is totally the same as the second lead-frame array of infrared remote control receiver modules 220.

The first lead-frame array of infrared remote control receiver modules 210 has multiple first modular functional areas 212, multiple first modular locating holes 214, multiple first modular pins 216 and multiple first modular lenses 218 on the first modular functional areas 212. The first modular locating holes 214 are used for locating the lead-frame matrix when producing the infrared remote control receiver modules. The first modular lenses are used for infrared ray to pass through them to trigger photoelectron elements on the first modular functional areas 212. Because the second lead-frame array of infrared remote control receiver modules 220 is the same as the first lead-frame array of infrared remote control receiver modules 210, the second lead-frame array of infrared remote control receiver modules 220 also has multiple second modular functional areas 222, multiple second modular locating holes 224, multiple second modular pins 226 and multiple second modular lenses 228.

The first lead-frame array of infrared remote control receiver modules 210 and the second lead-frame array of infrared remote control receiver modules 220 are alternatively inserted. The first modular pins 216 can be fit into the space between two adjacent second modular pins 226 to fill the space and to connect to the second lead-frame array of infrared remote control receiver modules 220. The second modular pins 226 can be fit into the space between two adjacent first modular pins 216 to fill the space and to connect to the first lead-frame array of infrared remote control receiver modules 210.

In FIG. 5, the lead-frame matrix of infrared remote control receiver modules 200 after being cutting is shown. In FIG. 5, the first lead-frame array of infrared remote control receiver modules 210 and the second lead-frame array of infrared remote control receiver modules 220 are cut apart. Meanwhile, the Is first modular locating holes 214 and the second modular locating holes 224 are also cut away from the first lead-frame array of infrared remote control receiver modules 210 and the second lead-frame array of infrared remote control receiver modules 220. Finally, the first lead-frame array of infrared remote control receiver modules 210 and the second lead-frame array of infrared remote control receiver modules 220 can be used to form infrared remote control receiver modules.

Accordingly, the present invention has the following advantages.

(1) The structure of the lead-frame matrix of photoelectron devices of the invention can reduce the production cost and thus generate profit from photoelectron devices. Moreover, because the production cost is lowered, the price of photoelectron device can be even cheaper.

(2) In the structure of the lead-frame matrix of photoelectron devices of the invention, more lead-frames can be produced on a lead-frame matrix with higher density of lead-frames. Half more lead-frames than what available on traditional lead-frame matrix can be produced based on the structure of the lead-frame matrix of the invention.

The preferred embodiments of the present invention described above should not be regarded as limitations to the present invention. It will be apparent to those skilled in the art that various modifications and variations can be made to the present invention without departing from the scope or spirit of the invention. The scope of the present invention is as defined in the appended claims.

What is claimed is:

1. A lead-frame matrix for photo-electronic devices, comprising:
   a receiver lead-frame array, comprising receiver lead-frames laterally connected to form a first row, each receiver lead-frame having two free pins and a free side; and
   a transmitter lead-frame array, comprising transmitter lead-frames laterally connected to form a second row substantially parallel to the first row, each transmitter lead-frame having two free pins and a free side,
   wherein each of the free receiver sides and each of the free transmitter sides are mutually spaced with a distance and each of the free receiver sides and the each of the transmitter sides are arranged transversely inwardly.

2. The lead-frame matrix according to claim 1, wherein the free sides of the receiver lead-frames and the free sides of the transmitter lead-frames are arranged in a row.

3. The lead-frame matrix according to claim 1, further comprising a light-emitting element disposed on each of the free sides of the receiver lead-frames and a light-receiving element disposed on each of the free sides of the transmitter lead-frames and each light-emitting element and each light-receiving element facing upwardly.

* * * * *